(12) United States Patent
Chen et al.

(10) Patent No.: US 11,818,838 B2
(45) Date of Patent: Nov. 14, 2023

(54) METAL-CLAD LAMINATE AND MANUFACTURING METHOD OF THE SAME

(71) Applicant: TAIWAN UNION TECHNOLOGY CORPORATION, Chupei (TW)

(72) Inventors: Wen-Ren Chen, Chupei (TW); Shi-Ing Huang, Chupei (TW); Shur-Fen Liu, Chupei (TW)

(73) Assignee: TAIWAN UNION TECHNOLOGY CORPORATION, Chupei (TW)

( * ) Notice: Subject to any disclaimer, the term of this patent is extended or adjusted under 35 U.S.C. 154(b) by 0 days.

(21) Appl. No.: 16/662,618

(22) Filed: Oct. 24, 2019

(65) Prior Publication Data
US 2020/0404782 A1 Dec. 24, 2020

(30) Foreign Application Priority Data
Jun. 21, 2019 (TW) ................................. 108121826

(51) Int. Cl.
*H05K 1/03* (2006.01)
*H05K 3/02* (2006.01)

(52) U.S. Cl.
CPC ............. *H05K 1/036* (2013.01); *H05K 3/022* (2013.01); *H05K 2201/015* (2013.01); *H05K 2201/0195* (2013.01); *H05K 2201/029* (2013.01); *H05K 2201/0293* (2013.01)

(58) Field of Classification Search
CPC ............. H05K 1/036; H05K 2201/015; H05K 2201/0195; H05K 2201/0203; H05K 2201/029; H05K 2201/0293; B32B 2255/02; B32B 2255/10; B32B 2260/02; B32B 2260/021; B32B 2260/046; B32B 17/02; B32B 17/04; B32B 2250/05; B32B 2250/40; B32B 2315/085; B32B 2457/08; Y10T 428/24058; Y10T 428/24124
USPC .......................................... 428/105, 113, 141
See application file for complete search history.

(56) References Cited

U.S. PATENT DOCUMENTS

| | | | |
|---|---|---|---|
| 4,849,284 A | 7/1989 | Arthur et al. | |
| 4,886,699 A * | 12/1989 | Carroll | B32B 5/26 442/235 |
| 5,281,466 A * | 1/1994 | Arthur | H05K 1/0373 174/250 |

(Continued)

FOREIGN PATENT DOCUMENTS

| | | |
|---|---|---|
| CN | 101838431 B | 11/2012 |
| CN | 103102627 B | 9/2015 |

*Primary Examiner* — Alicia J Weydemeyer
(74) *Attorney, Agent, or Firm* — Greer, Burns & Crain, Ltd

(57) ABSTRACT

A metal-clad laminate is provided. The metal-clad laminate includes:
  a dielectric layer, which has a first reinforcing material and a dielectric material formed on the surface of the first reinforcing material, wherein the dielectric material includes 60 wt % to 80 wt % of a first fluoropolymer and 20 wt % to 40 wt % of a first filler;
  an adhesive layer, which is disposed on at least one side of the dielectric layer and includes an adhesive material, wherein the adhesive material has 60 wt % to 70 wt % of a second fluoropolymer and 30 wt % to 40 wt % of a second filler; and
  a metal foil, which is disposed on the other side of the adhesive layer that is opposite to the dielectric layer,
wherein the melting point of the second fluoropolymer is lower than the melting point of the first fluoropolymer.

8 Claims, 1 Drawing Sheet

(56) References Cited

U.S. PATENT DOCUMENTS

| | | | |
|---|---|---|---|
| 6,783,841 B2* | 8/2004 | McCarthy | H05K 1/034 428/209 |
| 2010/0000771 A1 | 1/2010 | Shimauchi et al. | |
| 2018/0339493 A1 | 11/2018 | Chen et al. | |

* cited by examiner

METAL-CLAD LAMINATE AND MANUFACTURING METHOD OF THE SAME

CLAIM FOR PRIORITY

This application claims the benefit of Taiwan Patent Application No. 108121826 filed on Jun. 21, 2019, the subject matters of which are incorporated herein in their entirety by reference.

BACKGROUND

Field of the Invention

The present invention provides a metal-clad laminate, especially, a fluoropolymer metal-clad laminate, and a manufacturing method of the same. The fluoropolymer metal-clad laminate of the present invention is particularly suitable for use as a circuit substrate in high-frequency technical fields, including radio frequency (RF) applications, microwave applications, mm wave applications, antenna applications, radar applications, and the like. In particular, the fluoropolymer metal-clad laminate of the present invention can meet the need for high-level materials in advanced applications, such as 5th generation mobile networks (5G), advanced driver assistance systems (ADAS), and artificial intelligence (AI).

Descriptions of the Related Art

As a result of the development of high-frequency and high-speed transmission electronic products, miniaturization of electronic elements, and high-density wiring in substrates, there are higher demands on the requirements for the physicochemical properties of the electronic materials used. However, the characteristics of conventional epoxy resin dielectric materials have failed to keep up with the requirements, and thus, conventional dielectric materials used for metal-clad laminates are being replaced with fluoropolymers, such as polytetrafluoroethylene (PTFE). Generally, when a fluoropolymer is used as a dielectric material in a metal-clad laminate, the metal-clad laminate prepared therefrom will not only have excellent electrical properties (wherein both the dielectric constant (Dk) and the dielectric dissipation factor (Df) are low), but also have good chemical acid and alkali resistance, moisture resistance, and flame retardance.

However, a metal-clad laminate with fluoropolymer as the dielectric material has poor dimensional stability at different temperatures, especially for the coefficient of thermal expansion in the thickness direction of the substrate (Z-axis), hereinafter also referred to as "Z-CTE," which is usually more than 100 ppm/° C. As a result, products using fluoropolymer metal-clad laminates have poor reliability. To accommodate this shortcoming, a filler is conventionally added in an amount as great as possible in the fluoropolymer resin composition to increase filler loading, thereby, achieving the effect of improving dimensional stability. For example, U.S. Pat. No. 4,849,284 to Rogers Corporation discloses adding a large amount of ceramic filler to the fluoropolymer material so that the filler comprises at least 55 wt % of the entire material, thereby, reducing the Z-CTE. However, adding a large amount of filler to the fluoropolymer will result in a rapid increase in the viscosity of the composition. Therefore, when a reinforcing material is impregnated with the composition in the follow-up process, the composition cannot be distributed evenly on the reinforcing material, and the wetting of the composition to the reinforcing material becomes poor.

In addition, the fluoropolymer metal-clad laminate generally has insufficient peeling strength since the adhesion between the fluoropolymer and the metal foil of the laminate is generally poor. When a "low profile" metal foil is used in a laminate to meet the requirements for electrical properties (such as pursuing a lower dielectric dissipation), the anchor effect between the fluoropolymer and the metal foil is particularly insufficient. The bonding surface (bonding site) of the metal foil and the fluoropolymer dielectric layer is not subjected to a roughening process, and therefore, the prepared laminate has an even worse peeling strength. The bonding site refers to the surface of the metal foil facing the prepreg of the fluoropolymer dielectric layer. To solve the aforementioned problem of insufficient adhesion, a common method as disclosed by US patent application publication No. 20100000771 A1 is to additionally use an adhesive layer to improve the peeling strength performance of the fluoropolymer metal-clad laminate. As shown in FIG. 1, the method includes providing adhesive layers 12 (usually a fluoropolymer thin film of tetrafluoroethylene-hexafluoropropylene copolymer (FEP) or tetrafluoroethylene-perfluorinated alkylvinylether copolymer) on the sides of a dielectric layer 11 of a metal-clad laminate 1, and then pressing metal foils 13, adhesive layers 12 and dielectric layer 11 together to form the metal-clad laminate 1 (note: in order to show each element independently and clearly, the stacking structure of the metal-clad laminate is shown in a separate way). As a result, the peeling strength of the metal-clad laminate is improved. However, while the method of using a fluoropolymer thin film as an adhesive layer overcomes the problem of insufficient adhesion between the metal foil and the fluoropolymer dielectric layer, it does not solve the problem of the overly-high viscosity of the composition and non-even coating caused by adding a large amount of filler for the purpose of meeting the dimensional stability requirement.

In view of the above, there is a need for a technical solution that can provide a fluoropolymer laminate with good dimensional stability, an even thickness and good peeling strength.

SUMMARY

In view of the abovementioned technical problems, the present invention provides a metal-clad laminate that not only uses a fluoropolymer adhesive layer with a lower melting point to improve the adhesion between the dielectric layer and the metal foil but also introduces a specific ratio of filler into the adhesive layer of the laminate to efficiently reduce the amount of filler used in the core dielectric layer. The present invention addresses the following shortcomings of the prior art: the overly-high viscosity of the composition and the resulting uneven thickness of the fluoropolymer and poor reliability, wherein the aforementioned shortcomings are caused by adding a large amount of filler in the core dielectric layer for the purpose of achieving sufficient dimensional stability.

Therefore, an objective of the present invention is to provide a metal-clad laminate, which comprises:

a dielectric layer, which comprises a first reinforcing material and a dielectric material formed on the surface of the first reinforcing material, wherein the dielectric material comprises 60 wt % to 80 wt % of a first fluoropolymer and 20 wt % to 40 wt % of a first filler;

an adhesive layer, which is disposed on at least one side of the dielectric layer and comprises an adhesive material, wherein the adhesive material comprises 60 wt % to 70 wt % of a second fluoropolymer and 30 wt % to 40 wt % of a second filler; and a metal foil, which is disposed on the other side of the adhesive layer that is opposite to the dielectric layer, wherein the melting point of the second fluoropolymer is lower than the melting point of the first fluoropolymer.

In some embodiments of the present invention, the first fluoropolymer is polytetrafluoroethylene (PTFE).

In some embodiments of the present invention, the second fluoropolymer is selected from the group consisting of tetrafluoroethylene-hexafluoropropylene copolymer (FEP), tetrafluoroethylene-perfluorinated alkylvinylether copolymer, and combinations thereof.

In some embodiments of the present invention, the adhesive layer further comprises a second reinforcing material. The adhesive material is formed on the surface of the second reinforcing material.

In some embodiments of the present invention, the first reinforcing material and the second reinforcing material are each independently selected from the group consisting of E-glass fabric, NE-glass fabric, S-glass fabric, L-glass fabric, D-glass fabric, quartz glass fabric, Kevlar fabric, polytetrafluoroethylene (PTFE) fabric, polyester fabric, and liquid crystal polymer (LCP) fabric.

In some embodiments of the present invention, the first filler and the second filler are each independently selected from the group consisting of silica (including spherical silica, fused silica, non-fused silica, porous silica, hollow silica, and nano silica), aluminum oxide, magnesium oxide, magnesium hydroxide, calcium carbonate, talc, clay, aluminum nitride, boron nitride, aluminum hydroxide, silicon aluminum carbide, silicon carbide, sodium carbonate, titanium dioxide, zinc oxide, zirconium oxide, quartz, diamond, diamond-like carbon, graphite, calcined kaolin, pryan, mica, hydrotalcite, polytetrafluoroethylene (PTFE) powders, glass beads, ceramic whiskers, carbon nanotubes, nanosized inorganic powders, strontium titanate, and combinations thereof.

In some embodiments of the present invention, the metal-clad laminate has a surface roughness of less than 10 μm.

In some embodiments of the present invention, the metal-clad laminate has a coefficient of thermal expansion in the Z-axis direction (Z-CTE) of no more than 100 ppm/° C.

Another objective of the present invention is to provide a printed circuit board, which is prepared from the aforementioned metal-clad laminate.

Yet another objective of the present invention is to provide a manufacturing method of a metal-clad laminate, which comprises:

providing a dielectric layer, which comprises a first reinforcing material and a dielectric material formed on the surface of the first reinforcing material, wherein the dielectric material comprises 60 wt % to 80 wt % of a first fluoropolymer and 20 wt % to 40 wt % of a first filler;

providing an adhesive layer, which is disposed on at least one side of the dielectric layer and comprises an adhesive material, wherein the adhesive material comprises 60 wt % to 70 wt % of a second fluoropolymer and 30 wt % to 40 wt % of a second filler;

providing a metal foil and disposing the metal foil on the other side of the adhesive layer that is opposite to the dielectric layer to provide a superimposed object; and performing a hot-pressing step on the superimposed object to provide a metal-clad laminate, wherein the melting point of the second fluoropolymer is lower than the melting point of the first fluoropolymer.

To render the above objectives, technical features and advantages of the present invention more apparent, the present invention will be described in detail with reference to some embodiments hereinafter.

DETAILED DESCRIPTION

Hereinafter, some embodiments of the present invention will be described in detail. However, without departing from the spirit of the present invention, the present invention may be embodied in various embodiments and should not be limited to those described in the specification.

Unless it is additionally explained, the expressions "a," "the," or the like recited in the specification (especially in the claims) should include both the singular and the plural forms.

Unless it is additionally explained, while describing components in a solution, mixture, composition, or varnish in the specification, the amount of each component is calculated based on the dry weight, i.e., regardless of the weight of the solvent.

Unless it is additionally explained, the expressions "first," "second," or the like recited in the specification (especially in the claims) are only used to distinguish different elements or components. They do not have special meanings and are not intended to indicate sequential order.

Unless it is additionally explained, when referring to "impregnate" as a technical method in the specification, it should be understood that the technical method includes dipping, coating, spraying or other technical methods that have essentially the same function or efficacy.

By means of introducing a specific ratio of filler into the adhesive layer of the laminate, the present invention can especially solve the problems in the prior art of the overly-high viscosity of the composition and the resulting uneven thickness of the metal-clad laminate caused by adding a large amount of filler in the core dielectric layer for the purpose of achieving sufficient dimensional stability (Z-CTE being no more than 100 ppm/° C.). The metal-clad laminate provided by the present invention has good dimensional stability, even thickness and peeling strength. The technical features and efficacy of the present invention are described below via some embodiments.

1. Metal-Clad Laminate

Figure 1:
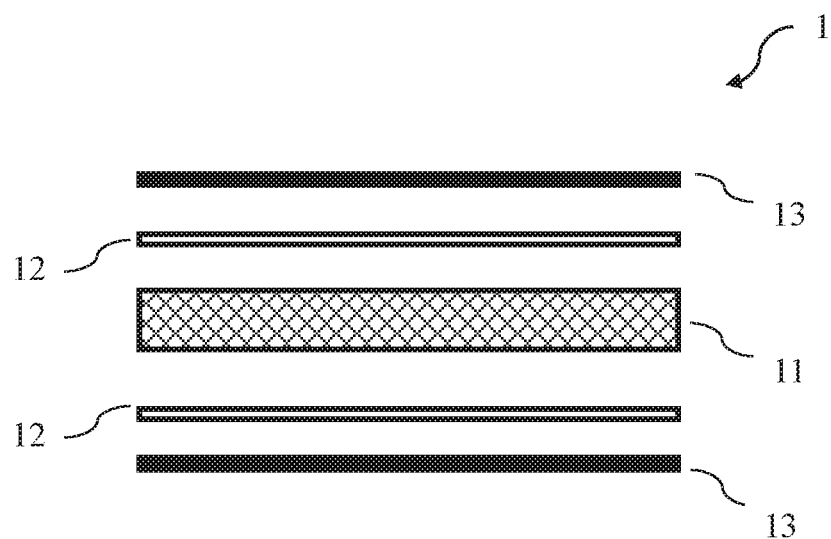
FIG. 1 is a schematic diagram showing a metal-clad laminate of the prior art.
Figure 2:
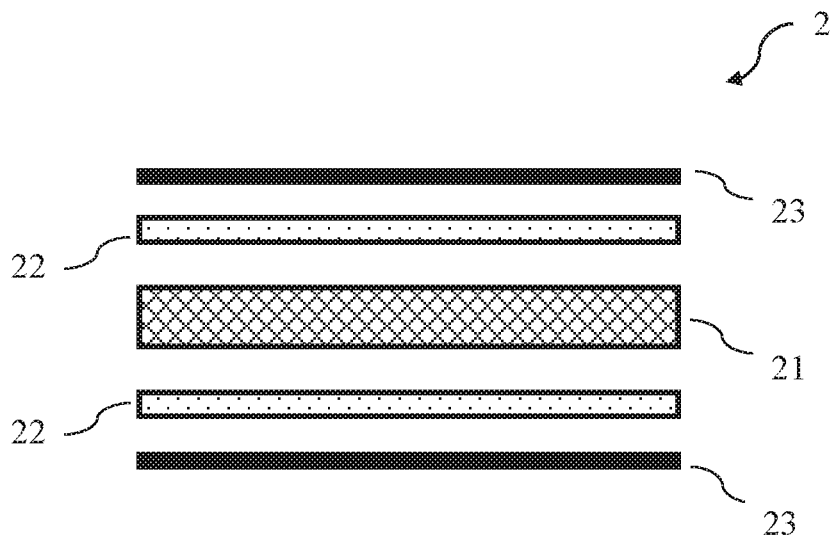
FIG. 2 is a schematic diagram showing an embodiment of the metal-clad laminate of the present invention.

The metal-clad laminate of the present invention comprises a dielectric layer, an adhesive layer disposed on at least one side of the dielectric layer, and a metal foil disposed on the other side of the adhesive layer that is opposite to the dielectric layer. FIG. 2 is a schematic diagram showing an embodiment of the metal-clad laminate of the present invention. To show each element independently and clearly, the stacking structure of the metal-clad laminate is shown in a separate way. As shown in FIG. 2, a metal-clad laminate 2 comprises a dielectric layer 21, adhesive layers 22, and metal foils 23, wherein one adhesive layer 22 is disposed on each of the two sides of the dielectric layer 21, and one metal foil 23 is disposed on each of the other sides of the adhesive layers 22 opposite to the dielectric layer.

In some embodiments of the present invention, the metal-clad laminate has a coefficient of thermal expansion in the Z-axis direction (Z-CTE) of no more than 100 ppm/° C.

1.1. Dielectric Layer of the Metal-Clad Laminate

The dielectric layer comprises a first reinforcing material and a dielectric material formed on the surface of the first reinforcing material. In some embodiments, the dielectric layer consists essentially of a first reinforcing material and a dielectric material, or consists of a first reinforcing material and a dielectric material.

1.1.1. First Reinforcing Material

The first reinforcing material or the second reinforcing material that will be described below refers to a fabric structural reinforcing material which is made by fibrous materials and in the form of woven fabric and non-woven fabric. Examples of the first reinforcing material include but are not limited to materials having high thermal stability, such as E-glass fabric, NE-glass fabric, S-glass fabric, L-glass fabric, D-glass fabric, quartz glass fabric, Kevlar fabric, polytetrafluoroethylene fabric, polyester fabric, aromatic polyester fabric, and liquid crystal polymer fabric. In the appended examples, E-glass fabric is used as the first reinforcing material.

1.1.2. Dielectric Material

The dielectric material comprises a first fluoropolymer and a first filler. In some embodiments, the dielectric material consists essentially of a first fluoropolymer and a first filler, or consists of a first fluoropolymer and a first filler. Based on the total weight of the dielectric material, the amount of the first fluoropolymer is 60 wt % to 80 wt %, preferably 60 wt % to 70 wt %, such as 61 wt %, 62 wt %, 63 wt %, 64 wt %, 65 wt %, 66 wt %, 67 wt %, 68 wt %, or 69 wt %. Based on the total weight of the dielectric material, the amount of the first filler is 20 wt % to 40 wt %, and preferably 30 wt % to 40 wt %, such as 31 wt %, 32 wt %, 33 wt %, 34 wt %, 35 wt %, 36 wt %, 37 wt %, 38 wt %, or 39 wt %. If the amount of the first filler is lower than the above range (such as lower than 20 wt %), the dimensional stability of the metal-clad laminate will become poor; on the other hand, if the amount of the first filler is higher than the above range (such as higher than 40 wt %), the evenness of thickness and the peeling strength of the metal-clad laminate will become poor.

The first fluoropolymer and the second fluoropolymer that will be described below refer to a homopolymer or a copolymer which contains fluorine atoms, specifically, a fluorocarbon-based polymer having multiple strong carbon-fluorine bonds. Generally, fluorine-containing polymers have characteristics such as solvent resistance, acid resistance and alkali resistance, and have excellent stability due to having strong carbon-fluorine bonds. In addition, fluorine-containing polymers also have excellent dielectric characteristics and a broad working temperature range, and can be applied in various industrial fields, such as electronical, chemical, and mechanical productions.

Specifically, the first fluoropolymer and the second fluoropolymer that will be described below can independently be a homopolymer of a monomer selected from the following group, a copolymer of two or more monomers selected from the following group, or a copolymer of monomers selected from the following group and other co-monomers: tetrafluoroethylene, vinylidene fluoride, vinyl fluoride, perfluoroether, tetrafluoroethylene-perfluoropropylene vinyl ether, and chlorotrifluoroethylene. Examples of other co-monomers include but are not limited to perfluoromethyl vinyl ether, perfluoropropylene vinyl ether, hexafluoropropylene, perfluorobutyl ethylene, ethylene, propylene, and butylene.

Specific examples of the first fluoropolymer and the second fluoropolymer that will be described below include polytetrafluoroethylene (PTFE), polychlorotrifluoroethylene (PCTFE), polyvinylidene fluoride, polyvinyl fluoride, tetrafluoroethylene-perfluorinated propylenevinylether copolymer (PFA), tetrafluoroethylene-hexafluoropropylene copolymer (FEP), and tetrafluoroethylene-ethylene copolymer. Each of the fluoropolymers can either be used alone or in any combination. In the appended examples, the first fluoropolymer is polytetrafluoroethylene (PTFE).

The types of the first filler and the second filler that will be described below are not particularly limited, and can be selected depending on the needs by persons having ordinary skill in the art. The fillers are selected to specifically improve properties of the metal-clad laminate, such as mechanical strength, thermal conductivity, or dimensional stability. In addition, the first filler and the second filler can be the same or different from each other. Examples of the first filler and the second filler include but are not limited to silica (including spherical silica, fused silica, non-fused silica, porous silica, hollow silica, and nano silica), aluminum oxide, magnesium oxide, magnesium hydroxide, calcium carbonate, talc, clay, aluminum nitride, boron nitride, aluminum hydroxide, silicon aluminum carbide, silicon carbide, sodium carbonate, titanium dioxide, zinc oxide, zirconium oxide, quartz, diamond, diamond-like carbon, graphite, calcined kaolin, pryan, mica, hydrotalcite, hollow silica, polytetrafluoroethylene powders, glass beads, ceramic whiskers, carbon nanotubes, nanosized inorganic powders, and strontium titanate. The foregoing fillers can either be used alone or in any combination. In the appended examples, the first filler is silica.

1.2. Adhesive Layer of the Metal-Clad Laminate

The adhesive layer comprises an adhesive material, or consists essentially of an adhesive material, or consists of an adhesive material. In some embodiments of the present invention, the adhesive layer comprises an adhesive material and a second reinforcing material, or consists essentially of an adhesive material and a second reinforcing material, or consists of an adhesive material and a second reinforcing material, wherein the adhesive material is formed on the surface of the second reinforcing material.

1.2.1. Second Reinforcing Material

The definition and examples of the second reinforcing material are as described above. The second reinforcing material can be the same or different from the first reinforcing material. In the appended examples, E-glass fabric is used as the second reinforcing material.

1.2.2. Adhesive Material

The adhesive material comprises a second fluoropolymer and a second filler. In some embodiments, the adhesive material consists essentially of a second fluoropolymer and a second filler, or consists of a second fluoropolymer and a second filler. Based on the total weight of the adhesive material, the amount of the second fluoropolymer is 60 wt % to 70 wt %, such as 61 wt %, 62 wt %, 63 wt %, 64 wt %, 65 wt %, 66 wt %, 67 wt %, 68 wt %, or 69 wt %; and based on the total weight of the adhesive material, the amount of the second filler is 30 wt % to 40 wt %, such as 31 wt %, 32 wt %, 33 wt %, 34 wt %, 35 wt %, 36 wt %, 37 wt %, 38 wt %, or 39 wt %. If the amount of the second filler is lower than the above range (such as lower than 30 wt %), the dimensional stability of the metal-clad laminate will become poor. On the other hand, if the amount of the second filler is higher than the above range (such as higher than 40 wt %), the thickness will become uneven and the peeling strength of the metal-clad laminate will become poor.

The definition and the examples of the second fluoropolymer are as described above, wherein the second fluoropolymer is different from the first fluoropolymer. The melting point of the second fluoropolymer is lower than the melting point of first fluoropolymer. For example, the melting point of the first fluoropolymer can be about 325° C. to about 340° C., and the melting point of the second fluoropolymer can be about 250° C. to about 320° C. As such, the resin flow characteristic of the second fluoropolymer is better than that of the first fluoropolymer during the hot-pressing process, thereby, improving the adhesion between the dielectric layer and the metal foil. In some embodiments of the present invention, the first fluoropolymer is polytetrafluoroethylene (PTFE, having a melting point of about 330° C.) and the second fluoropolymer is preferably tetrafluoroethylene-perfluorinated propylenevinylether copolymer (PFA, having a melting point of about 310° C.) or tetrafluoroethylene-hexafluoropropylene copolymer (FEP, having a melting point of about 260° C.). PFA and FEP can provide a better resin flow characteristic than PTFE can during the hot-pressing process. Regarding information on the resin flow characteristic and other properties of PFA and FEP, reference may be made to patent documents, such as CN 101838431 B and CN 103102627 B to Sheng Yi Technology Co., Ltd., the subject matters of which are incorporated herein in their entirety by reference.

The definition and the examples of the second filler are as described above. In the appended examples, silica is used as the second filler.

1.3. Metal Foil of the Metal-Clad Laminate

Examples of the metal foil include but are not limited to materials with good electrical conductivity, such as copper, stainless steel, aluminum, zinc, iron, nickel, gold, silver, transition metals, or alloys of two or more of the foregoing metals. In some embodiments of the present invention, a copper foil is used, and the surface of the copper foil may or may not be subjected to roughening. Examples of the copper foil include but are not limited to high temperature elongation (HTE) copper foil (surface roughness Ra: 6 μm to 10 μm), reverse treatment foil (RTF) (Ra: 2 μm to 5 μm), very low profile (VLP) copper foil (Ra: less than 2 μm), and hyper very low profile (HVLP) copper foil (Ra: less than 1.5 μm).

2. Printed Circuit Board

The metal-clad laminate of the present invention can be formed into a printed circuit board by further patterning the external metal foil thereof. Therefore, the present invention also provides a printed circuit board, which is prepared by further patterning the external metal foil of the laminate of the present invention. The method for patterning the metal foil is not particularly limited, and examples thereof include but are not limited to photolithography, screen printing, and ink-jet printing.

3. Manufacturing Method of a Metal-Clad Laminate

The manufacturing method of a metal-clad laminate of the present invention comprises the following steps:

providing a dielectric layer, which comprises a first reinforcing material and a dielectric material formed on the surface of the first reinforcing material, wherein the dielectric material comprises 60 wt % to 80 wt % of a first fluoropolymer and 20 wt % to 40 wt % of a first filler;

providing an adhesive layer, which is disposed on at least one side of the dielectric layer and comprises an adhesive material, wherein the adhesive material comprises 60 wt % to 70 wt % of a second fluoropolymer and 30 wt % to 40 wt % of a second filler;

providing a metal foil and disposing the metal foil on the other side of the adhesive layer that is opposite to the dielectric layer to provide a superimposed object; and performing a hot-pressing step on the superimposed object to provide a metal-clad laminate, wherein the definitions of the first reinforcing material, the dielectric material, the adhesive material and the metal foil are as described above.

In some embodiments of the present invention, the metal-clad laminate is prepared by the following method.

At first, a first fluoropolymer (such as PTFE) and a first filler are mixed and dispersed in a solvent to form a varnish containing a dielectric material. A first reinforcing material is impregnated with the varnish containing the dielectric material; and then the impregnated reinforcing material is subjected to sintering at a temperature not lower than the melting point of the first fluoropolymer to obtain a dielectric layer prepreg. The steps of impregnating and sintering above may be repeated for several times (such as 2 to 4 times) until the dielectric layer prepreg reaches a desired thickness. Generally, the amount of the first fluoropolymer is controlled to be 35 wt % to 70 wt % of the dielectric layer prepreg, but the present invention is not limited thereto.

Then, a second fluoropolymer (such as PFA or FEP, the melting point of which has to be lower than that of the first fluoropolymer) and a second filler are mixed and dispersed in a solvent to form a varnish containing an adhesive material. The varnish containing the adhesive material can be formed into a film at a temperature not lower than the melting point of the second fluoropolymer by baking or extrusion to form an adhesive layer prepreg.

After that, the dielectric layer prepreg (may be in the form of a single sheet or multiple sheets being stacked in advance), the adhesive layer prepreg, and a metal foil (such as copper foil) are superimposed to provide a superimposed object. The superimposed object is then subjected to hot-pressing to obtain the fluoropolymer metal-clad laminate of the present invention, wherein the hot-pressing temperature is preferably higher than the melting points of the first fluoropolymer and the second fluoropolymer. The dielectric layer prepreg used may be in the form of a single sheet or multiple sheets being stacked in advance. The adhesive layer prepreg and the corresponding metal foil can be disposed on one side or two sides of the dielectric layer prepreg (the case of being disposed on two sides is shown in FIG. 2).

4. Examples 4.1. Testing Method

The present invention is further illustrated by the embodiments hereinafter, wherein the testing instruments and methods are provided below.

[Peeling Strength Test]

The peeling strength refers to the bonding strength between the metal foil and the prepreg. In the test, the peeling strength is expressed as the force required to vertically peel copper foil with a width of ⅛ inch from the surface of the hot-pressed laminated prepreg. The unit of the peeling strength is pounds per inch (lbf/in).

[Coefficient of Thermal Expansion in the Z-Axis Direction (Z-CTE) Test]

The test is conducted using a thermal mechanical analyzer (TMA). A laminate, whose metal foil was removed by etching, is sized at 5 mm×5 mm×1.5 mm and used as the sample. The sample is heated with a heating rate of 10° C./min from 30° C. to 260° C., and the change in the size of the sample per ° C. in the range of 50° C. to 150° C. is determined.

[Evenness of Thickness Test]

A laminate, whose metal foil was removed by etching, is sized at 24 inches in length×18 inches in width and used as the sample. 5 points are chosen each along the length and along the width, for a total of 25 points on the sample. The thickness of the sample is measured at these points, and the evenness of thickness is calculated with the formula "[(Maximum value−Minimum value)/Average value]×100%."

4.2. List of Raw Materials Used in Examples and Comparative Examples

TABLE 1

List of Raw Materials

| Raw Material | Description and Source |
| --- | --- |
| DISP30 | PTFE dispersion, available from Chemours Corporation |
| PFAD355D | PFA dispersion, available from Chemours Corporation |
| Filler | $SiO_2$ ceramic filler, model No. 1040, available from Novoray |
| PFA film | PFA adhesive film without fillers, available from Saint Gobain |
| HTE copper foil | High temperature elongation copper foil, model No. PLS, available from Chang Chun Group (CCP) |
| VLP copper foil | Very low profile copper foil (i.e., low roughness copper foil), available from Furukawa |

4.3. Preparation of the Metal-Clad Laminate

Example 1

1000 grams of PTFE dispersion (the solid content of PTFE being 60 wt %) and 400 grams of the filler were mixed evenly to form a varnish of dielectric material (i.e., based on the solid content of the varnish, the amount of filler being 40 wt %). A 1080-type E-glass fabric was impregnated with the varnish, and was subjected to baking at 360° C. to obtain a PTFE prepreg. In addition, 1170 grams of PFA dispersion (the solid content of PFA being 60 wt %) and 300 grams of the filler were mixed evenly to form a varnish of adhesive material (i.e., based on the solid content of the varnish, the amount of filler being 30 wt %). After that, a 1067-type E-glass fabric was impregnated with the varnish, and was subjected to baking at 330° C. to obtain a PFA prepreg containing a filler. Then, 4 sheets of the PTFE prepreg obtained above were first stacked (as the dielectric layer), and then 1 sheet of the PFA prepreg obtained above (as the adhesive layer) was attached to each of the upper and lower sides of the dielectric layer. Finally, 1 sheet of half-oz HTE copper foil was disposed on each of the upper and lower adhesive layers. After that, a pressing step was conducted using a high temperature vacuum hot press furnace under the condition of 380° C. and 3 MPa for 90 minutes to obtain a metal-clad laminate.

Example 2

1000 grams of PTFE dispersion (the solid content of PTFE being 60 wt %) and 400 grams of the filler were mixed evenly to form a varnish of dielectric material (i.e., based on the solid content of the varnish, the amount of filler being 40 wt %). A 1080-type E-glass fabric was then impregnated with the varnish, and was subjected to baking at 360° C. to obtain a PTFE prepreg. In addition, 1000 grams of PFA dispersion (the solid content of PFA being 60 wt %) and 400 grams of the filler were mixed evenly to form a varnish of adhesive material (i.e., based on the solid content of the varnish, the amount of filler being 40 wt %). After that, the varnish was coated on the shiny side of a copper foil by using a scraper, subjected to baking at 330° C., and then stripped off to obtain a filler-containing PFA film. Then, 4 sheets of the PTFE prepreg obtained above were first stacked (as the dielectric layer), and then 1 sheet of the filler-containing PFA film obtained above (as the adhesive layer) was attached to each of the upper and lower sides of the dielectric layer. Finally, 1 sheet of half-oz HTE copper foil was disposed on each of the upper and lower adhesive layers. After that, a pressing step was conducted using a high temperature vacuum hot press furnace under the condition of 380° C. and 3 MPa for 90 minutes to obtain a metal-clad laminate.

Comparative Example 1

1250 grams of PTFE dispersion (the solid content of PTFE being 60 wt %) and 250 grams of the filler were mixed evenly to form a varnish of dielectric material (i.e., based on the solid content of the varnish, the amount of filler being 25 wt %). A 1080-type E-glass fabric was then impregnated with the varnish, and was subjected to baking at 360° C. to obtain a PTFE prepreg. Then, 4 sheets of the PTFE prepreg obtained above were first stacked (as the dielectric layer), and then 1 sheet of a PFA film without fillers purchased from Saint Gobain (as the adhesive layer) was attached to each of the upper and lower sides of the dielectric layer. Finally, 1 sheet of half-oz HTE copper foil was disposed on each of the upper and lower adhesive layers. After that, a pressing step was conducted using a high temperature vacuum hot press furnace under the condition of 380° C. and 3 MPa for 90 minutes to obtain a metal-clad laminate.

Comparative Example 2

830 grams of PTFE dispersion (the solid content of PTFE being 60 wt %) and 500 grams of the filler were mixed evenly to form a varnish of dielectric material (i.e. based on the solid content of the varnish, the amount of filler being 50 wt %). A 1080-type E-glass fabric was then impregnated with the varnish, and was subjected to baking at 360° C. to obtain a PTFE prepreg. Then, 4 sheets of the PTFE prepreg obtained above were first stacked (as the dielectric layer), and then, without attaching any adhesive prepreg or adhesive film (i.e., without any adhesive layer), 1 sheet of half-oz HTE copper foil was disposed on each of the upper and lower sides of the stacked PTFE prepreg. After that, a pressing step was conducted using a high temperature vacuum hot press furnace under the condition of 380° C. and 3 MPa for 90 minutes to obtain a metal-clad laminate.

Comparative Example 3

830 grams of PTFE dispersion (the solid content of PTFE being 60 wt %) and 500 grams of the filler were mixed evenly to form a varnish of dielectric material (i.e., based on the solid content of the varnish, the amount of filler is 50 wt %). A 1080-type E-glass fabric was then impregnated with the varnish, and was subjected to baking at 360° C. to obtain a PTFE prepreg. In addition, a 1067-type E-glass fabric was impregnated with PFA dispersion (the solid content of PFA being 60 wt %), and was subjected to baking at 330° C. to obtain a PFA prepreg without fillers. Then, 4 sheets of the PTFE prepreg obtained above were first stacked (as the dielectric layer), and then 1 sheet of the PFA prepreg without fillers obtained above (as the adhesive layer) was attached to each of the upper and lower sides of the dielectric layer. Finally, 1 sheet of half-oz HTE copper foil was disposed on each of the upper and lower adhesive layers. After that, a pressing step was conducted using a high temperature vacuum hot press furnace under the condition of 380° C. and 3 MPa for 90 minutes to obtain a metal-clad laminate.

Comparative Example 4

830 grams of PTFE dispersion (the solid content of PTFE being 60 wt %) and 500 grams of the filler were mixed evenly to form a varnish of dielectric material (i.e., based on the solid content of the varnish, the amount of filler being 50 wt %). A 1080-type E-glass fabric was then impregnated with the varnish, and was subjected to baking at 360° C. to obtain a PTFE prepreg. Then, 4 sheets of the PTFE prepreg obtained above were first stacked (as the dielectric layer), and then 1 sheet of a PFA film without fillers purchased from Saint Gobain (as the adhesive layer) was attached to each of the upper and lower sides of the dielectric layer. Finally, 1 sheet of half-oz HTE copper foil was disposed on each of the upper and lower adhesive layers. After that, a pressing step was conducted using a high temperature vacuum hot press furnace under the condition of 380° C. and 3 MPa for 90 minutes to obtain a metal-clad laminate.

Comparative Example 5

1000 grams of PTFE dispersion (the solid content of PTFE being 60 wt %) and 400 grams of the filler were mixed evenly to form a varnish of dielectric material (i.e., based on the solid content of the varnish, the amount of filler being 40 wt %). A 1080-type E-glass fabric was then impregnated with the varnish, and was subjected to baking at 360° C. to obtain a PTFE prepreg. In addition, 1340 grams of PFA dispersion (the solid content of PFA being 60 wt %) and 200 grams of the filler were mixed evenly to form a varnish of adhesive material (i.e., based on the solid content of the varnish, the amount of filler being 20 wt %). After that, the varnish was coated on the shiny side of a copper foil by using a scraper, subjected to baking at 330° C., and then stripped off to obtain a filler-containing PFA film. Then, 4 sheets of the PTFE prepreg obtained above were first stacked (as the dielectric layer), and then 1 sheet of the filler-containing PFA film obtained above (as the adhesive layer) was attached to each of the upper and lower sides of the dielectric layer. Finally, 1 sheet of half-oz HTE copper foil was disposed on each of the upper and lower adhesive layers. After that, a pressing step was conducted using a high temperature vacuum hot press furnace under the condition of 380° C. and 3 MPa for 90 minutes to obtain a metal-clad laminate.

4.4. Property Measurements of the Metal-Clad Laminates

The metal-clad laminates prepared from Examples 1 and 2 and Comparative Examples 1 to 5 were tested, and the test results are shown in Table 2.

TABLE 2

The compositions and properties of the metal-clad laminates of Examples 1 and 2 and Comparative Examples 1 to 5

|  | Example 1 | Example 2 | Comparative Example 1 | Comparative Example 2 | Comparative Example 3 | Comparative Example 4 | Comparative Example 5 |
|---|---|---|---|---|---|---|---|
| Glass fabric of the dielectric layer | E-glass fabric 1080-type | E-glass fabric 1080-type | E-glass fabric 1080-type | E-glass fabric 1080-type | E-glass fabric 1080-type | E-glass fabric 1080-type | E-glass fabric 1080-type |
| Amount of the filler in the dielectric layer (wt %) | 40 | 40 | 25 | 50 | 50 | 50 | 40 |
| Adhesive layer | PFA prepreg | PFA film | PFA film | none | PFA prepreg | PFA film | PFA film |
| Amount of the filler in the adhesive layer (wt %) | 30 | 40 | 0 | 0 | 0 | 0 | 20 |
| Z-CTE (ppm/° C.) | 97.8 | 67.2 | 158.1 | 27.3 | 60 | 37.8 | 115.8 |
| Evenness of thickness (%) | 6.2 | 5.7 | 4.1 | 9.3 | 11.1 | 8.2 | 5.8 |
| Peeling strength (lbf/in) | 6.2 | 7.0 | 6.5 | 2.7 | 8.3 | 9.9 | 7.8 |

As shown in Table 2, each of the metal-clad laminates of the present invention exhibits satisfactory properties. Specifically, in Examples 1 and 2, the amount of the filler in the dielectric layers is reduced to 40 wt % and the adhesive layers also have an amount of the filler from 30 wt % to 40 wt %, so that the metal-clad laminates prepared have good dimensional stability (Z-CTE being lower than 100 ppm/° C.) and have good evenness of thickness and peeling strength. Example 2 shows that when the amount of the filler in the adhesive layer is raised to 40 wt %, the Z-CTE of the metal-clad laminate prepared can be reduced to 67.2 ppm/° C. and the evenness of thickness and peeling strength can be further improved.

By contrast, the metal-clad laminates which are not according to the present invention cannot simultaneously satisfy the properties required. Specifically, Comparative Example 1 contains only 25 wt % of the filler in the dielectric layer and the adhesive layer does not contain fillers, so the dimensional stability (Z-CTE) is clearly worse. Comparative Example 2 adopts the method of the prior art which uses a high amount of filler (50 wt %) in the dielectric layer to pursue a good Z-CTE and does not use an adhesive layer, yet the evenness of thickness and peeling strength of the metal-clad laminate are clearly worse. Comparative Examples 3 and 4 adopt the method of the prior art which increases the amount of filler in the dielectric layer to 50 wt % to pursue good dimensional stability (Z-CTE) and uses an adhesive layer without fillers to improve the peeling strength, yet the evenness of thickness of the metal-clad laminates is extremely poor. Comparative Example 5 shows that although it reduces the amount of filler in the dielectric layer to 40 wt % and uses filler-containing adhesive layers (the amount of filler being different from the present invention), the dimensional stability of the metal-clad laminate is still poor (higher than 100 ppm/° C.).

The above examples are used to illustrate the principle and efficacy of the present invention and show the inventive features thereof. People skilled in this field may proceed with a variety of modifications and replacements based on the disclosures and suggestions of the invention as described without departing from the principle and spirit thereof. Therefore, the scope of protection of the present invention is that as defined in the claims as appended.

BRIEF DESCRIPTION OF REFERENCE NUMERALS 1, 2: metal-clad laminate
11, 21: dielectric layer
12, 22: adhesive layer
13, 23: metal foil

What is claimed is:

1. A metal-clad laminate, comprising:
    a dielectric layer, which comprises a first reinforcing material and a dielectric material formed on the surface of the first reinforcing material, wherein the dielectric material comprises 60 wt % to 70 wt % of a first fluoropolymer and 30 wt % to 40 wt % of a first filler;
    an adhesive layer, which is disposed on at least one side of the dielectric layer and comprises an adhesive material, wherein the adhesive material comprises 60 wt % to 70 wt % of a second fluoropolymer and 30 wt % to 40 wt % of a second filler; and
    a metal foil, which is disposed on the other side of the adhesive layer that is opposite to the dielectric layer,
    wherein the melting point of the second fluoropolymer is lower than the melting point of the first fluoropolymer;
    wherein the first fluoropolymer is polytetrafluoroethylene (PTFE);
    wherein the second fluoropolymer is selected from the group consisting of tetrafluoroethylene-hexafluoropropylene copolymer (FEP), tetrafluoroethylene-perfluorinated alkylvinylether copolymer, and combinations thereof;
    wherein the first filler and the second filler each consist of silica; and
    wherein the metal-clad laminate has a coefficient of thermal expansion in the Z-axis direction (Z-CTE) of no more than 100 ppm/° C.; and
    wherein the metal-clad laminate has an evenness of thickness of 4.1% to 6.8%.

2. The metal-clad laminate of claim 1, wherein the adhesive layer further comprises a second reinforcing material, and the adhesive material is formed on the surface of the second reinforcing material.

3. The metal-clad laminate of claim 1, wherein the first reinforcing material is selected from the group consisting of E-glass fabric, NE-glass fabric, S-glass fabric, L-glass fabric, D-glass fabric, quartz glass fabric, KEVLAR® para-aramid fabric, polytetrafluoroethylene (PTFE) fabric, polyester fabric, and liquid crystal polymer (LCP) fabric.

4. The metal-clad laminate of claim 2, wherein the first reinforcing material and the second reinforcing material are each independently selected from the group consisting of E-glass fabric, NE-glass fabric, S-glass fabric, L-glass fabric, D-glass fabric, quartz glass fabric, KEVLAR® para-aramid fabric, polytetrafluoroethylene (PTFE) fabric, polyester fabric, and liquid crystal polymer (LCP) fabric.

5. The metal-clad laminate of claim 1, wherein the metal-clad laminate has a surface roughness of less than 10 μm.

6. The metal-clad laminate of claim 2, wherein the metal-clad laminate has a surface roughness of less than 10 μm.

7. A printed circuit board, which is prepared from the metal-clad laminate of claim 1.

8. A manufacturing method of a metal-clad laminate, comprising:
    providing a dielectric layer, which comprises a first reinforcing material and a dielectric material formed on the surface of the first reinforcing material, wherein the dielectric material comprises 60 wt % to 70 wt % of a first fluoropolymer and 30 wt % to 40 wt % of a first filler;
    providing an adhesive layer, which is disposed on at least one side of the dielectric layer and comprises an adhesive material, wherein the adhesive material comprises 60 wt % to 70 wt % of a second fluoropolymer and 30 wt % to 40 wt % of a second filler;
    providing a metal foil and disposing the metal foil on the other side of the adhesive layer that is opposite to the dielectric layer to provide a superimposed object; and
    performing a hot-pressing step on the superimposed object to provide a metal-clad laminate,
    wherein the melting point of the second fluoropolymer is lower than the melting point of the first fluoropolymer;
    wherein the first fluoropolymer is polytetrafluoroethylene (PTFE);
    wherein the second fluoropolymer is selected from the group consisting of tetrafluoroethylene-hexafluoropropylene copolymer (FEP), tetrafluoroethylene-perfluorinated alkylvinylether copolymer, and combinations thereof;
    wherein the first filler and the second filler each consist of silica; and
    wherein the metal-clad laminate has a coefficient of thermal expansion in the Z-axis direction (Z-CTE) of no more than 100 ppm/° C.; and
    wherein the metal-clad laminate has an evenness of thickness of 4.1% to 6.8%.

* * * * *